United States Patent [19]

Hattori et al.

[11] Patent Number: 5,040,039

[45] Date of Patent: Aug. 13, 1991

[54] SEMICONDUCTOR PHOTODETECTOR DEVICE

[75] Inventors: Ryo Hattori; Misao Hironaka, both of Itami, Japan

[73] Assignee: Mitsubishi Denki Kabushiki Kaisha, Japan

[21] Appl. No.: 563,411

[22] Filed: Aug. 7, 1990

[30] Foreign Application Priority Data

Jan. 25, 1990 [JP] Japan .................................. 2-16654

[51] Int. Cl.$^5$ ..................... H01L 31/10; H01L 29/44; H01L 27/15
[52] U.S. Cl. ......................................... 357/30; 357/65
[58] Field of Search ..................................... 357/30, 65

[56] References Cited

FOREIGN PATENT DOCUMENTS

| 0186460 | 7/1986 | European Pat. Off. |  |
|---|---|---|---|
| 60-182778 | 9/1985 | Japan | 357/30 |
| 63-224268 | 9/1988 | Japan | 357/30 |

OTHER PUBLICATIONS

Martinelli et al., "Reliability of Planar InGaAs/InP Photodiodes Passivated with Boro-Phospho-Silicate Glass", Journal of Applied Physics, vol. 63, No. 1, Jan. 1988, pp. 250-252.

*Primary Examiner*—Jerome Jackson, Jr.
*Attorney, Agent, or Firm*—Leydig, Voit & Mayer

[57] ABSTRACT

A photodetector device includes a stack of a light-absorbing layer, a window layer on a substrate, and a region in the window layer formed by reversing the conductivity type of the window layer extending to the light-absorbing layer. A surface protecting film is disposed on the window layer, with a light receiving area being left uncovered. An electrode makes ohmic contact with the reversed conductivity region and surrounds the light receiving area. A metallic light-blocking film is disposed on the protecting film with an insulating gap therebetween. The inner edge of the light-absorbing film is located in alignment with or inward of the p-n junction between the reversed conductivity type region and the window layer.

12 Claims, 4 Drawing Sheets

SEMICONDUCTOR PHOTODETECTOR DEVICE

This invention relates to a semiconductor photodetector device, and, more particularly, to a fast response photodiode.

BACKGROUND OF THE INVENTION

FIG. 1 shows a cross-section of a typical example of conventional InGaAs planar photodiode. On one surface of an n+-type InP substrate 1, an n-type InP buffer layer 2, an n⁻-type InGaAs light-absorbing layer 3, and an n⁻-type InP window layer 4 are formed in a stack in the named order with the layer 2 contacting the substrate 1. A p-type impurity, such as Zn, is diffused from a portion of the surface of the n⁻-type InP window layer 4 to reverse the conductivity type of portions of the window and light-absorbing layers 4 and 3 and to thereby form a reversedconductivity type region, i.e. p+-type region 5. The bottom of the p+-type region 5 extends into the n⁻-type InGaAs lightabsorbing layer 3. A broken line 12 in FIG. 1 represents the front of a depletion layer 3a. In the illustrated case, the front 12 substantially provides a p-n junction between the p+-type region 5, and the n⁻-type InP window layer 4 and the n⁻-type InCaAs liqht-absorbing layer 3.

A surface protecting insulating film 6, such as a silicon nitride (SiN) film, is formed by, for example, plasma CVD, to cover the n⁻-type InP window layer, leaving uncovered at least the portion which provides a light receiving area 11. A positive electrode 7 is formed in ohmic contact with the p+-type region 5 within the opening in the insulating film 6 where the light receiving area 11 is provided. Also, a metallic light-blocking film 8 is formed over the insulating film 6, with a gap 9 disposed between the positive electrode 7 and the light-blocking film 6 to provide electrical insulation therebetween. On the opposite surface of the n+-type InP substrate 1, a negative electrode 10 is formed in ohmic contact with the substrate 1.

In this planar photodiode light incident on the light receiving area 11 passes through the window layer 4 and a substantial portion of the light is absorbed by the light-absorbing layer 3, in particular, by the depletion layer 3a. Carriers 31, indicated by dots, generated by absorption of light by the depletion layer 3a, are accelerated by the electric field within the depletion region 3a. Thus, the carriers provide a drift current component which responds very quickly to an input light signal and is detected as a light-responsive electric signal flowing between the electrodes 7 and 10.

Light incident on other portions, such as the gap 9 between the electrode 7 and the light-blocking film 8 of the device is absorbed by portions of the light-absorbing layer 3 other than the depletion layer 3a, which generates carriers 32 indicated by small circles. The carriers 32 diffuse and reach the depletion layer front 12 or p-n junction and, therefore, are included in the detection current as a diffusion current component. The diffusion current component is generated due to the spatial density gradient of the carriers 12 and therefore the speed of movement of the carriers 32 which provide the diffusion current component is much slower than the carriers 31 which provide the drift current component. This speed decreases the response time of the device to the input light signal.

A photodiode which is free of the above-described drawback, i.e. a slow response to an input light signal, of the conventional device shown in FIG. 1 is shown in, for example, Japanese Published Patent Application No. SHO 55-140275. FIG. 2 shows a cross-section of a major portion of a photodiode shown in this Japanese application. The same reference numerals are attached to similar portions of the photodiodes of FIGS. 1 and 2, and they are not described further. A positive electrode 71 makes an ohmic contact to the p+-type region 5 within the opening in the insulating film 6 where the light receiving area 11 is provided, as in the photodiode of FIG. 1. A portion of the positive electrode 71 extends beyond an opening 23 in a wire-bonding region to provide an extension 72. An insulating film 21 of, for example, phosphosilicate glass (PSG) is disposed over the insulating film 6 and the positive electrode 71. A metallic light-blocking film 22 is formed over the insulating film 21. The opening 23 for wire bonding is formed through the insulating film 21 and the light-blocking film 22. A connection wire is bonded to the positive electrode 71 in the opening 23.

In the planar photodiode shown in FIG. 2, the bottom of the opening 23 for wire bonding is closed by the extension 72 of the positive electrode 71, and, therefore, light incident on the opening 23 is entirely blocked Accordingly, only light that is incident on the light receiving area 11 passes through the window layer and reaches the depletion layer 3a in the light-absorbing layer 3, and, accordingly, only carriers 31 that substantially contribute to the generation of a drift current component are generated. Generation of carriers in the portions of the light absorption layer 3 other than the depletion layer 3a is avoided and therefore, substantially no diffusion current component is generated Accordingly, the reduction in responsed time which otherwise would be caused by a diffusion current component is prevented.

Although the response degradation attributable to a diffusion current component can be avoided, the planar photodiode of FIG. 2 has a disadvantage in that it requires additional steps for forming the insulating film 21 the metallic light-blocking film 22, and the opening 23 for the wire bonding. The addition of such manufacturing steps raises manufacturing costs. Another disadvantage of the structure of FIG. 2 is that a large parasitic electrostatic capacitance is formed between the metallic light-blocking film 22 and the positive electrode 71 which increases the time constant of the device. An increase in the time constant decreases the response speed of the output of the device to the input light signal.

It is, therefore, desired to have a semiconductor photodetector device which is free of the above-described disadvantages of conventional devices by completely blocking light incident on portions of the device other than a predetermined light receiving area, preventing a light-blocking film from increasing parasitic capacitance, and also avoiding increasing the number of the manufacturing steps relative to the FIG. 1 device.

SUMMARY OF THE INVENTION

A semiconductor device according to the present invention comprises a substrate of a first conductivity type, a light-absorbing layer of the first conductivity type formed directly, or with a buffer layer interposed, over one major surface of the substrate, and a window layer of the first conductivity type formed over the light-absorbing layer. A region of a second conductivity type is formed by reversing the conductivity type of at least a portion of the window layer and a portion of the light-absorbing layer so that the region extends into the light-absorbing layer. A surface protecting film is formed over said window layer, leaving uncovered at least that portion of the surface of the reversed conductivity type region where a light receiving area is provided. A first electrode is formed to overlie that portion of the surface protecting film which surrounds the light receiving area. The first electrode is in ohmic contact with the reversed conductivity type region. A metallic light-blocking film is formed over the surface protecting film. The light-blocking film surrounds the first electrode with an isolation gap having a predetermined width disposed between them. A second electrode is formed over the opposite major surface of the substrate to make an ohmic contact therewith. The light-blocking metallic film is formed in such a shape that the edge of the light-blocking film facing the first electrode with the gap disposed therebetween is not located outward of the p-n junction between the reversed conductivity type region and the window layer.

DESCRIPTION OF PREFERRED EMBODIMENT

Figure 3:
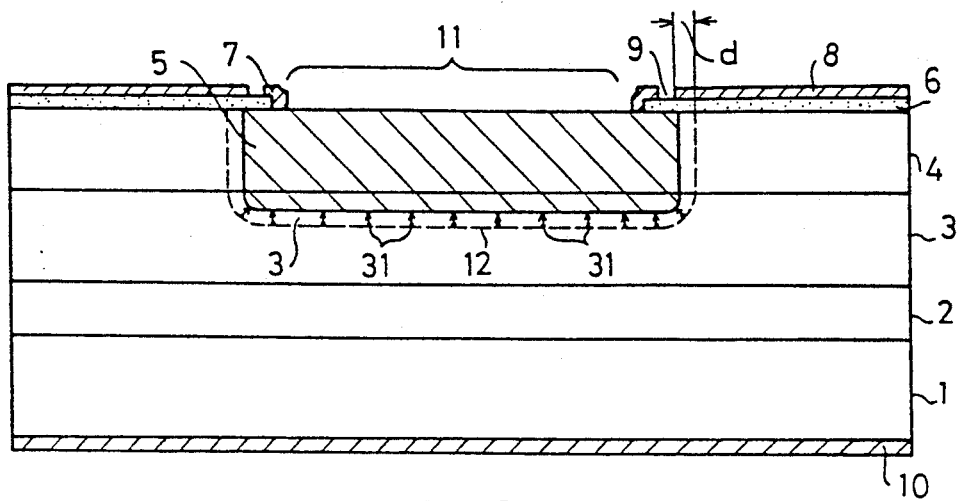
FIG. 3 is a cross-sectional view of a photodetector device according to one embodiment of the present invention, showing a cross-section along the line III—III in FIG. 4.
Figure 4:
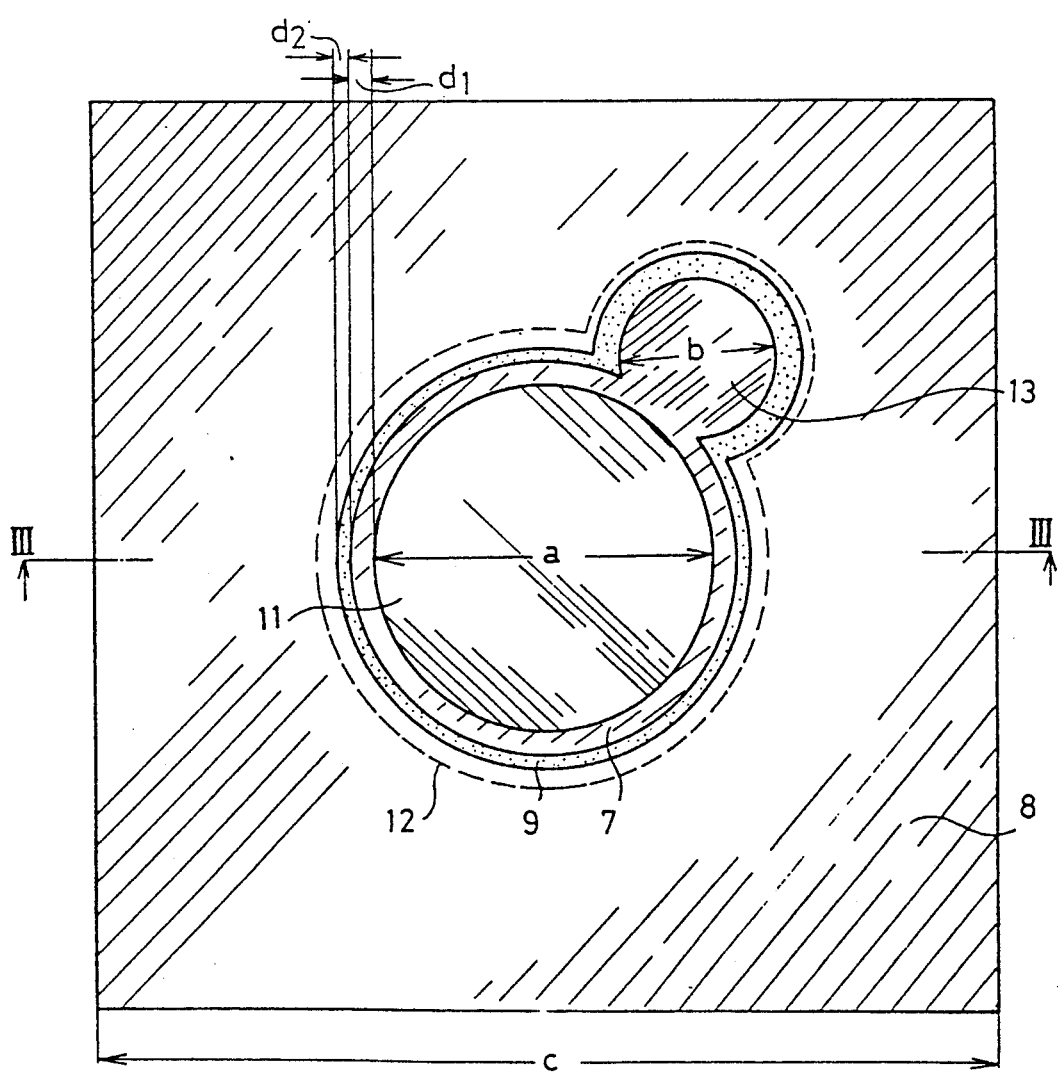
FIG. 4 is a plan view of the semiconductor photodetector device shown in FIG. 3, observed from a light receiving area side.

Referring to FIGS. 3 and 4, a semiconductor photodetector device of the present invention is described in terms of a planar photodiode. The same reference numerals are used for similar components as in FIGS. 1, 3 and 4.

Figure 1:
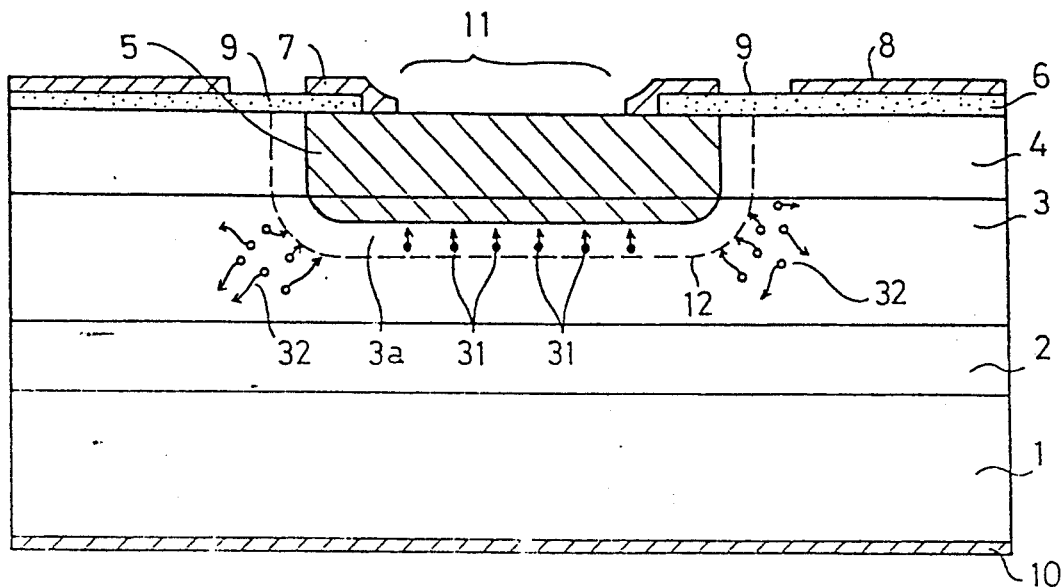
FIG. 1 is a cross-sectional view of a first example of a conventional semiconductor photodetector device.

The planar photodiode of FIG. 3 comprises, as the conventional photodiode shown in FIG. 1, an n-type InP buffer layer 2, an n⁻-type InGaAs light-absorbing layer 3 and an n⁻-type InP window layer 4 which are stacked in the named order on one surface of an n⁺-type InP substrate 1, with the n⁻-type buffer layer 2 contacting the substrate 1. A negative electrode 10 comprising Au is bonded to the opposite surface of the substrate 1 by means of, for example, an AuGe eutectic solder. A p-type impurity, such as Zn, is diffused from a portion of the surface of the n⁻-type InP window layer 4 into the layer stack to reverse the conductivity type of portions of the window and light-absorbing layers 4 and 3 for forming a reversed conductivity type, p⁺-type, region 5 which extends from the surface of the window layer 4 through the window layer 4 into the light-absorbing layer 3. A broken line 12 indicates the front of a depletion layer 3a which provides a substantial p-n junction between the reversed conductivity type, p⁺-type, region 5, and the n⁻-type InP window layer 4 and the n⁻-type InGaAs light-absorbing layer 3.

A surface protecting insulating film 6 which is a dielectric film of, for example, silicon nitride (SiN) or silicon oxide (SiO₂), is formed by means of, for example, plasma CVD to cover the surface of the n⁻-type InP window layer 4, leaving at least a surface portion uncovered which provides a light receiving area 11. In other words, an opening is left in the insulating film 6, for the light receiving area 11. In the opening, a Ti/Au positive electrode 7 comprising a stack of Ti and Au layers is formed to make an ohmic contact with the reversed conductivity type p⁺-type region 5. The positive electrode 7 may be in ohmic contact directly to the reversed conductivity p⁺-type region 5, or may be in ohmic contact through an ohmic contact layer comprising p-type InGaAs or InGaAsP so as to provide a good ohmic contact.

A metallic film 8 for blocking light is formed over the insulating film 6 with a gap 9 interposed between the metallic film 8 and the positive electrode 7 so that they are electrically isolated from each other. The metallic light-blocking film 8 is formed in such a shape that its inner edge facing the positive electrode 7 is in vertical alignment with or inward of the outer periphery of the depletion layer 3a defined by the front 12. In other words, the inner edge of the metallic light-blocking film 8 is closer to the light receiving area 11 than the depletion layer front 12 is. That is the inner edge of the metallic film 8 is not located outward of the depletion layer front 12. In FIG. 3, a horizontal spacing d between the inner edge of the metallic light-blocking film 8 and the vertical broken line indicating the depletion layer front 12 represents the amount of overlap of the film 8 with the portion of the device within the boundary defined by the front 12. Thus, when the inner edge of the metallic light-blocking film 8 is in vertical alignment with the depletion layer front 12, the overlap amount d is zero. If the inner edge of the metallic light-blocking film is within the boundary defined by the depletion layer front 12, d > 0, i.e. the metallic lightblocking film 8 slightly overlaps the depletion layer 3a or both the depletion layer 3a and the p⁺-type region 5. If the metallic light-blocking film 8 overlaps with too large a portion of the reversed conductivity type region 5, the parasitic capacitance formed between them becomes non-negligible. Accordingly, an appropriate value of d is about 0-5 μm.

FIG. 4 is a plan view of the planar photodiode of FIG. 3. A part of the electrode 7 protrudes outwardly to form a wire bonding pad 13. The reversed conductivity type region 5 and the depletion layer front 12 also protrude outwardly accordingly.

Figure 5:
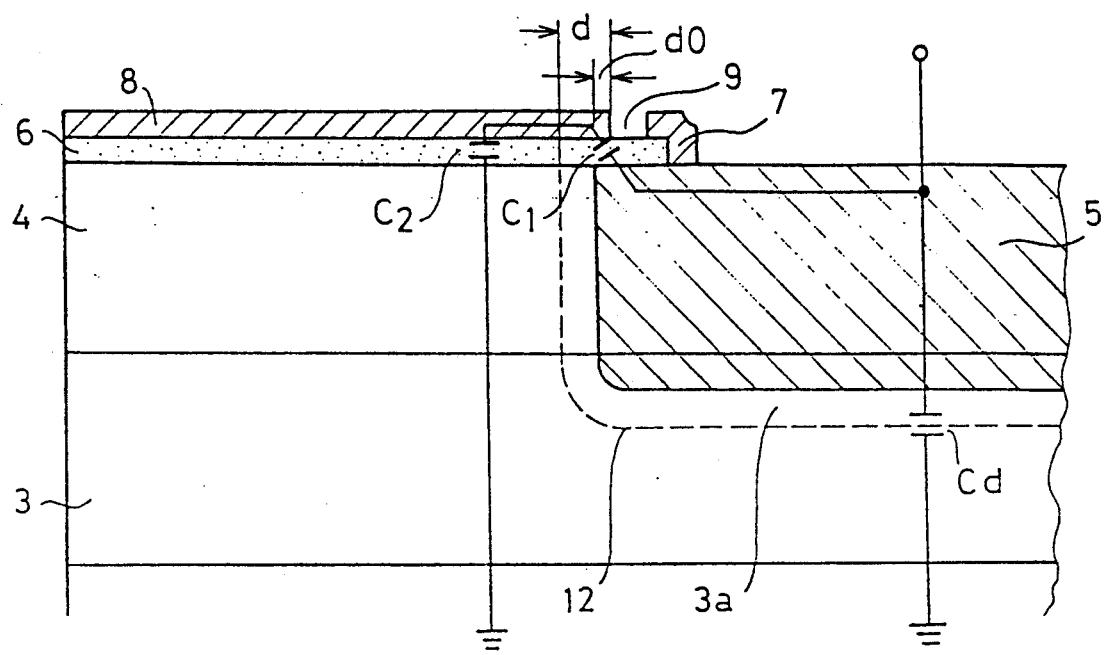
FIGS. 5 and 6 respectively illustrate the amount d of overlap of a metallic light-blocking film with the portion of the device of FIGS. 3 and 4 within the boundary defined by a depletion layer front, and a schematic circuit diagram of the stray parasitic capacitance produced.
Figure 6:
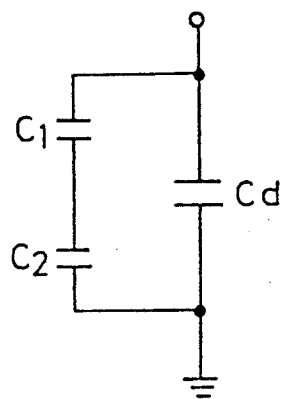

Referring to FIGS. 5 and 6 the relationship between the above-described overlap amount d and the stray parasitic capacitance is briefly explained.

In FIG. 5, d is the total amount of overlap of the film 8 with the portion of layers within the boundary defined by the depletion layer front 12, and dO is the amount of overlap of the film 8 with the p⁺-type region 5. $C_d$ is the capacitance of the depletion layer 3a, $C_1$ is the capacitance of the overall overlap, and $C_2$ is the capacitance of the metallic light-blocking film 8. As is seen from FIG.

6, the total capacitance $C_T$ provided by the combination of the capacitances $C_d$, $C_1$ and $C_2$ is expressed as follows.

$$C_T = \frac{C_1 \cdot C_2}{C_1 + C_1} + C_d \qquad (1)$$

The area of the overlap is small relative to the entire area of the metallic light-blocking film 8, so $C_1 < C_2$ and, therefore, the expression (1) can he modified to $$C_T = C_d + C_1 \qquad (2)$$

From the expression (2), it is understood that in order to reduce the total capacitance $C_T$, it is necessary to reduce the capacitance $C_1$ exhibited by the overall overlap. In order to reduce the entire capacitance $C_T$ and also reduce the amount of light absorbed by the portion of the light-absorbing layer 3 other than the depletion layer 3a, it would be desirable for d to be zero (d = 0). In practice, however, it is thought to be appropriate that dO = 0 or $0 \leq d \leq 5$ μm, considering variations in dimensions which could occur in the photolithographic steps during the manufacturing process. If the diameter a of the light receiving area 11 is less than the value in the following example, for example, if it is about 50 μm, it is desirable to limit for d.

The dimension and impurity concentrations of various portions of one example of the photodiode are shown below.

| | |
|---|---|
| Diameter a of Light Receiving Area 11: | 200 μm |
| Diameter b of Wire Bonding Pad 13: | 80 μm |
| Size c of Chip: | 500 μm × 500 μm |
| Width $d_1$ of Electrode 7: | 4 μm |
| Width $d_2$ of Gap 9: | 5 μm |
| Carrier Concentration of Substrate 1: | about $5 \times 10^{18}$ cm$^{-3}$ or so |
| Carrier Concentration of Buffer Layer 2: | about $5 \times 10^{15}$ cm$^{-3}$ or so |
| Carrier Concentration of Light Absorbing Layer 3: | $1 \times 10^{16}$ cm$^{-3}$ or less, preferably $1 \times 10^{15}$ cm$^{-3}$ or less |
| Carrier Concentration of Window Layer 4: | $1 \times 10^{16}$ cm$^{-3}$ or less, preferably $1 \times 10^{15}$ cm$^{-3}$ or less |
| Carrier Concentration of Reversed Conductivity p$^+$-type Region 5: | about $1 \times 10^{18}$ ~ $1 \times 10^{19}$ cm$^{-3}$ or so |

The planar photodiode of the present invention shown in FIGS. 3 and 4 operates in substantially the same manner as the conventional photodiode shown in FIG. 1. Light incident on the light receiving area 11 passes through the reversed conductivity p$^+$-type region 5 in the window layer 4 and is substantially absorbed by the depletion layer 3a of the light-absorbing layer 3. Carriers 31 represented by dots generated through the absorption of light by the depletion layer 3a are accelerated by the electric field within the depletion layer 3a and are detected between the electrodes 7 and 10 as an input light responsive drift current component. According to the present invention since d is $\leq 0$, light incident on the gap 9 also passes through the p$^-$-type region 5 and is absorbed by the depletion layer 3a in the light-absorbing layer 3, or it passes through the depletion layer in the window layer 4 around the p$^+$-type region 5 to the depletion layer 3a in the light-absorbing layer 3 and is absorbed by the depletion layer 3a. Thus these carriers generated by the absorption of the light through the gap 9 are of the same type as the carriers 31, and, therefore, they are also accelerated by the electric field within the depletion layer 3a and detected between the electrodes 7 and 10 as a drift current component, too. In the photodiode of the present invention too carriers like the ones 32, which are detected as a diffusion current component, shown in FIG. 1 may be generated in portions of the light-absorbing layer 3 other than the depletion layer 3a. However in the photodiode of the present invention, substantially no light is absorbed in portions other than the depletion layer 3a and therefore, the carriers 32 which may be detected as a diffusion current, practically neglibible are very few relative to the carriers 31 which are detected as the drift current component. Accordingly, substantially no diffusion current component which could cause decrease in the response speed is contained in the current to be detected between the electrodes 7 and 10. Consequently, the response to the input light signal of the photodiode of the present invention is very fast.

Figure 7:
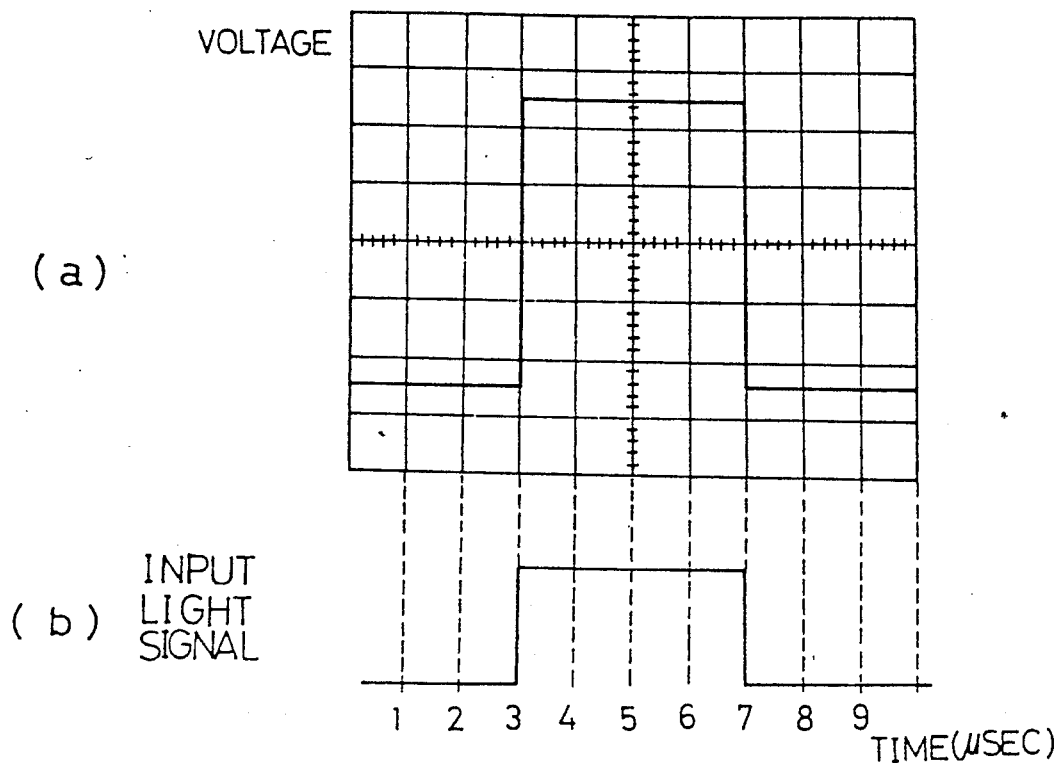
FIG. 7(a) is a response of the semiconductor photodetector device of the present invention to the input light signal shown in FIG. 7(b)
Figure 8:
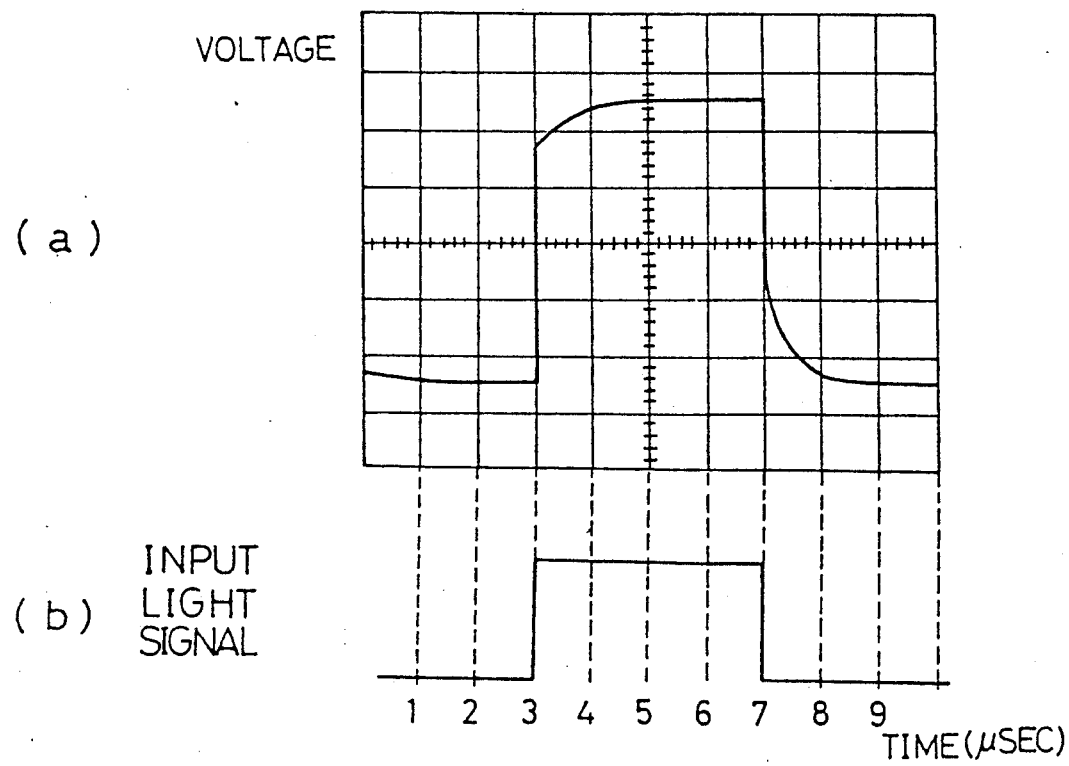
FIG. 8(a) shows a response of a semiconductor photodetector device which does not include a metallic light-blocking film to an input light signal shown in FIG. 8(b).

FIG. 7(a) shows the response of light-induced current to an input light pulse signal shown in FIG. 7(b) of the photodiode of the present invention shown in FIG. 3 in which the amount of overlap of the metallic light-blocking film 8 with the reversed conductivity p$^+$-type region 5 or the depletion layer 3a is zero, i.e. d = 0. FIG. 8(a) shows the response of light-induced current to a similar input light pulse signal, shown in FIG. 8(b), of a photodiode which has the same structure as the photodiode shown in FIG. 3 except that it does not include the metallic light-blocking film 8. It has been ascertained that a photodiode which has a structure that is the structure the same as that of the planar photodiode of FIG. 3 but does not include the metallic light-blocking film 8 has substantially the same response characteristic as the conventional planar photodiode shown in FIG. 1. As shown in FIG. 7, the rise and fall times are less than about 1 nanosecond, but the rise and fall times in the planar photodiode without the metallic light-blocking film 8 and hence those of the conventional planar photodiode shown in FIG. 1 are about 150 nanoseconds as shown in FIG. 8.

In addition to diffusing a p-type impurity, such as Zn, from the surface of the window layer 4 as in the above-described embodiment, the reversed conductivity p$^+$-type region 5 may be formed by ion implantation. Alternatively, the region 5 may be formed through solid-phase diffusion of, for example, Zn into the n$^-$-type InGaAs light-absorbing layer 3 from an epitaxially grown p$^+$-type InP layer containing Zn grown on the layer 3.

As a modification an anti-reflection film of, for example, SiN may be disposed on the surface of the light receiving area 11. In such a case, the thickness t of the anti-reflection SiN film should be set to such a value as to satisfy an expression $\lambda/4 = n \cdot t$, where $\lambda$ is the wavelength of light used and n is the index of refraction of the SiN film.

Figure 2:
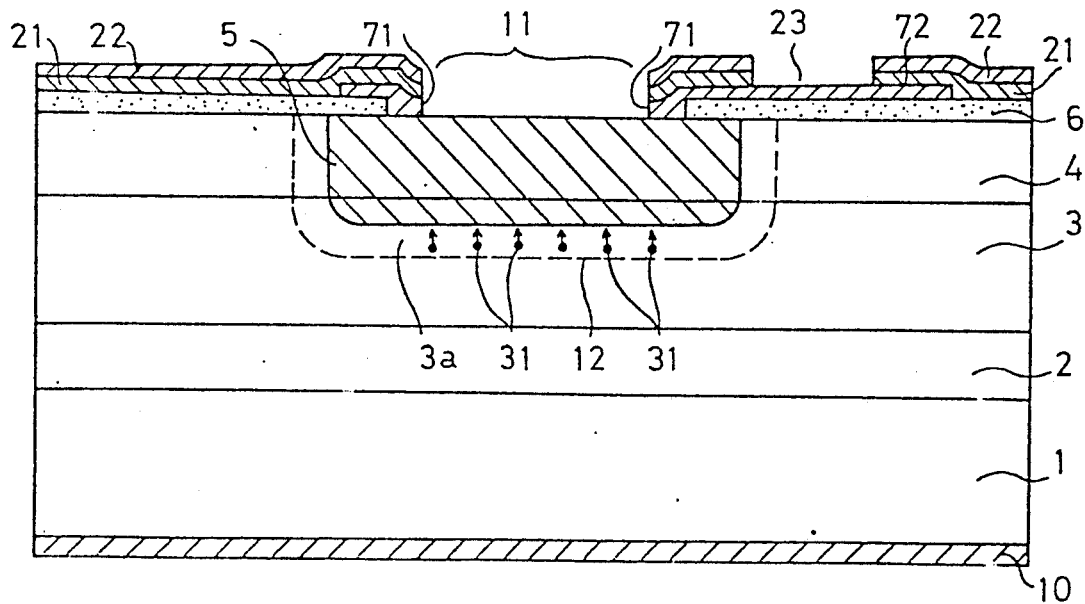
FIG. 2 is a cross-sectional view of a second example of a conventional semiconductor photodetector device.

As described above according to the present invention since the metallic light-blocking film 8 is so shaped that light enters through the light receiving area 11 only into the reversed conductivity p$^+$-type region 5 substantially all of the carriers generated by the incident light are detected as a drift current component and accordingly, very fast response to an input light signal is achieved Another advantage of the present invention is that since the positive electrode 7 and the metallic lightblocking film 8 are in the same plane, they can be formed simultaneously by patterning in a photolithographic process from a single metallic film which has been formed by a single vapor deposition process. (Of course, other techniques may be employed for forming the single metallic film and for patterning it.) Accordingly, the number of steps for manufacturing the photodetector of the present invention can he reduced relative to that for the conventional device shown in FIG. 2, and the manufacturing efficiency is high. Thus, according to the present invention semiconductor photodetector devices with very fast response to input light signals can be manufactured at low costs with substantially the same number of manufacturing steps as that for manufacturing the conventional planar photodiode shown in FIG. 1.

What is claimed is:

1. A semiconductor photodetector device comprising:
   a substrate of a first conductivity type;
   a light-absorbing layer of the first conductivity type disposed on said substrate;
   a window layer of the first conductivity type disposed on said light-absorbing layer opposite said substrate;
   a region of a second conductivity type opposite the first conductivity type disposed in a portion of said window layer extending to said light-absorbing layer and forming a conductivity type junction with said window layer;
   a surface-protecting film disposed directly on and contacting said window layer including an aperture leaving a portion of said second conductivity type region exposed as a light-receiving area;
   a first electrode disposed on said surface-protecting film surrounding said light-receiving area and in ohmic contact with said second conductivity type region;
   a metallic light-blocking film disposed directly on and contacting said surface-protecting film surrounding said first electrode with a gap therebetween electrically insulating said metallic light-blocking film from said first electrode, said metallic light-blocking film having an inner edge at the gap opposite said first electrode; and
   a second electrode disposed on said substrate opposite said light-absorbing layer in ohmic contact therewith wherein the inner edge or said metallic light-blocking film is located no farther outward from said light-receiving area than the conductivity type junction between said second conductivity type region and said window layer.

2. A semiconductor photodetector device according to claim 1 wherein the inner edge of said metallic light-blocking film is aligned with the conductivity type junction between second conductivity type region and said window layer.

3. A semiconductor photodetector device according to claim 1 wherein the inner edge of said metallic light-blocking film is located inward, relative to said light-receiving area, of the conductivity type junction between said second conductivity type region and said window layer.

4. A semiconductor photodetector device according to claim 1 including an anti-reflection film disposed on said light-receiving area.

5. A semiconductor photodetector device according to claim 3 including an anti-reflection film disposed on said light-receiving area.

6. A semiconductor photodetector device according to claim 1 including an anti-reflection film disposed on said light-receiving area.

7. A semiconductor photodetector device according to claim 1 including a buffer layer of the first conductivity type interposed between said light-absorbing layer and said substrate.

8. A semiconductor photodetector device according to claim 7 wherein the inner edge of said metallic light-blocking film is aligned with the conductivity type junction between said second conductivity type region and said window layer.

9. A semiconductor photodetector device according to claim 7 wherein the inner edge of said metallic light-blocking film is located inward, relative to said light-receiving area, of the conductivity type junction between said second conductivity type region and said window layer.

10. A semiconductor photodetector device according to claim 7 wherein an anti-reflection film disposed on said light-receiving area.

11. A semiconductor photodetector device according to claim 8 wherein an anti-reflection film disposed said light-receiving area.

12. A semiconductor photodetector device according to claim 9 wherein an anti-reflection film disposed said light-receiving area.

* * * * *

UNITED STATES PATENT AND TRADEMARK OFFICE
CERTIFICATE OF CORRECTION

PATENT NO. : 5,040,039

DATED : August 13, 1991

INVENTOR(S) : Hattori et al

It is certified that error appears in the above-identified patent and that said Letters Patent is hereby corrected as shown below:

```
Column 8, line 19, change "3" to --2--;
         line 22, change "1" to --3--;
         line 44, after "disposed" insert --on--;
         line 47, after "disposed" insert --on--.
```

Signed and Sealed this

Twenty-seventh Day of April, 1993

Attest:

MICHAEL K. KIRK

Attesting Officer

Acting Commissioner of Patents and Trademarks